United States Patent [19]

Hsieh et al.

[11] Patent Number: 5,066,568

[45] Date of Patent: Nov. 19, 1991

[54] METHOD OF DEVELOPING NEGATIVE WORKING PHOTOGRAPHIC ELEMENTS

[75] Inventors: Shane Hsieh, Bridgewater; Wayne A. Mitchell, Bound Brook, both of N.J.

[73] Assignee: Hoechst Celanese Corporation, Somerville, N.J.

[21] Appl. No.: 587,210

[22] Filed: Sep. 24, 1990

Related U.S. Application Data

[62] Division of Ser. No. 762,602, Aug. 5, 1985, Pat. No. 4,980,271.

[51] Int. Cl.$^5$ ................................................ G03C 5/29
[52] U.S. Cl. .................................... 430/325; 430/175; 430/192; 430/331; 430/302; 430/309
[58] Field of Search .............. 430/331, 325, 175, 192, 430/302, 309

[56] References Cited

U.S. PATENT DOCUMENTS

| | | |
|---|---|---|
| 2,717,243 | 9/1955 | Bloch et al. . |
| 3,189,448 | 6/1965 | Bean . |
| 3,257,941 | 6/1966 | Wolfson et al. . |
| 3,289,577 | 12/1966 | Uhlig . |
| 3,300,309 | 1/1967 | Chu . |
| 3,373,115 | 3/1968 | Steppan . |
| 3,669,660 | 6/1972 | Golda et al. . |
| 3,841,876 | 10/1974 | Takemoto et al. . |
| 3,891,439 | 6/1975 | Katz et al. . |
| 3,898,186 | 8/1975 | Mermelstein ............... 252/547 |
| 3,963,649 | 6/1976 | Spadini et al. ............... 252/548 |
| 4,087,387 | 5/1978 | Willems et al. . |
| 4,107,064 | 8/1978 | Nelson et al. ............... 252/174.19 |
| 4,175,062 | 11/1979 | Disch et al. . |
| 4,186,006 | 1/1980 | Kobayashi et al. . |
| 4,191,570 | 3/1980 | Herting et al. . |
| 4,278,571 | 7/1981 | Choy . |
| 4,287,297 | 9/1981 | Ishihara et al. . |
| 4,294,905 | 10/1981 | Okishi et al. . |
| 4,294,910 | 10/1981 | Wielinga . |
| 4,329,422 | 5/1982 | Langlais . |
| 4,348,954 | 9/1982 | Okishi . |
| 4,391,897 | 7/1983 | Gracia et al. . |
| 4,414,315 | 12/1983 | Gracia et al. . |
| 4,454,060 | 6/1984 | Lai et al. . |
| 4,472,494 | 9/1984 | Hallman et al. . |
| 4,501,810 | 2/1985 | Fromson et al. . |
| 4,786,580 | 11/1988 | Hsieh et al. ............... 430/331 |
| 4,83,1340 | 4/1983 | Walls . |

FOREIGN PATENT DOCUMENTS

| | | |
|---|---|---|
| 0008059 | 2/1980 | European Pat. Off. . |
| 0051081 | 12/1982 | European Pat. Off. . |
| 2002906 | 7/1971 | Fed. Rep. of Germany . |
| 2505252 | 8/1975 | Fed. Rep. of Germany . |
| 5804099 | 11/1983 | Japan . |
| 1492620 | 11/1977 | United Kingdom . |

OTHER PUBLICATIONS

Patent Abstracts of Japan, vol. 5 #5-Jan. 14, 1981.

*Primary Examiner*—Charles L. Bowers, Jr.
*Assistant Examiner*—John S. Y. Chu
*Attorney, Agent, or Firm*—Richard S. Roberts

[57] ABSTRACT

The invention is a method for preparing a photographic element which comprises imagewise exposing a photographic element, and removing the non-image areas thereof by contacting said element with a composition consisting essentially of in admixture:

a) from at least about 5% to about 30% by weight of the developer of benzyl alcohol; and b) from about 1% to about 20% by weight of the developer of one of more compound selected from the group consisting of sodium xylene sulfonate and sodium cumene sulfonate; and c) from about 5% to about 40% by weight of the developer of potassium toluene sulfonate; and d) water in sufficient amount of formulate effective developer for imagewise exposed photographic elements.

14 Claims, No Drawings

METHOD OF DEVELOPING NEGATIVE WORKING PHOTOGRAPHIC ELEMENTS

This is a division of copending application Ser. No. 06/762,602 filed on Aug. 5, 1985, U.S. Pat. No. 4,980,271.

BACKGROUND OF THE INVENTION

The present invention relates to developer compositions for photographic elements comprising photosensitive coatings on substrates, or more particularly to developer compositions for removing the non-image areas of exposed lithographic printing plates.

In the past, various methods of developing printing plates have been employed. Such methods include the use of compositions containing organic solvents, surfactants, salts, acids and other art recognized materials in solution.

It is most desirable to have a developer composition which is capable of completing development in a short period of time. The oleophilic image areas of the printing plate should be ink receptive and water repellent whereas the hydrophilic non-image areas should be water receptive and greasy ink repellent.

The proper selection of organic solvents as components of the developer solution is very important. If the selected solvent is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, nonimage areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

To provide a partial solution to the problem, volatile solvents are used in many prior art developer compositions. It is expected that the use of such volatile solvents in the developer solution will prevent tackiness in the image by permitting rapid evaporation. However, use of large amounts of water soluble, low boiling point solvents for example, as used in the developer described in U.S. Pat. No. 3,954,472, produces the problems of working sanitation, hazards due to low flash point, and pollution. A reduction of the concentration of these water soluble low boiling point solvents helps to minimize these problems in the working environment, however, the speed of development will be adversely affected. Also the tackiness of the coatings is reduced but not completely eliminated.

To improve the speed of development of developer solutions containing a lower concentration of low boiling points solvents, an adjuvant organic solvent is sometimes added. Unfortunately, such developers suffer from several drawbacks including: toxicity, developer instability, odor or inability to effectively clean out unwanted background non-image areas.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts, quinone diazides and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419. Typical prior art developing compositions are described in U.S. Pat. Nos. 2,754,279; 4,381,340 and German OLS 2,216,419.

In order to achieve the optimum performance from lithographic printing plates, it is a common practice to have different developer compositions formulated for each printing plate type with different binders in their photosensitive compositions. It is also a common practice to have different developer compositions formulated for each printing plate with the same binder in their photosensitive compositions but coated on substrates which are grained mechanically and/or electrolytically.

The present invention improves upon the aforementioned drawbacks of other lithographic developers. It provides a method for developing different types of printing plates with one single developer composition. The developer composition of this invention will also develop printing plates on both mechanically and electrolytically grained aluminum substrate with no substantial difference in ease of development.

It is an object of this invention to provide a developer for lithographic printing plates which will enable the operator to prepare a plate substantially free from objectionable redeposit, foaming and further having a reduced solvent odor and having a higher flash point while simultaneously achieving commercially acceptable removal of non-imaged areas for an extremely long developer life. The developer has a good balance of activity. It is neither too aggressive, nor does it require a long development time while simultaneously being capable of developing a wide range of plate types which have a varied photosensitive composition.

SUMMARY OF THE INVENTION

The invention provides a composition and method for preparing a photographic element which comprises imagewise exposing a photographic element comprising a light sensitive photographic composition disposed on a substrate and then removing the non-image areas of said exposed element with an aqueous developer consisting essentially of, in admixture:

a) from at least about 5% to about 30% by weight benzyl alcohol; and
b) from about 1% to about 20% by weight of one or more compounds selected from the group consisting of sodium xylene sulfonate and sodium cumene sulfonate; and
c) from about 5% to about 40% by weight potassium toluene sulfonate; and
d) water The developer may optionally contain salts, anti-oxidants and an anionic or non-ionic surfactant.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3303 and Alcoa 1100, which may or may not have been pretreated by standard mechanical or electrolytic graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt, quinone diazide or photopolymer containing composition. Such compositions may also contain binding resins, such as polyvinyl acetal or polyvinyl formal resins, novolaks, polyurethanes, polyvinyl acetates, styrene/maleic anhydride copolymers, colorants, acid stabilizers, surfactants, exposure indicators or other art recognized ingredients.

The photosensitive sheet material is then exposed to a suitable radiation source through a mask or transparency, and the exposed sheet then developed for removal of the non-image photosensitive materials.

The mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392.

A most preferred diazonium salt is the polycondensation product of 3-methoxy-4-diazo-diphenyl amine sulfate and 4,4'-bis-methoxy methyl-diphenyl ether, precipitated as the mesitylene sulfonate, as taught in U.S. Pat. No. 3,849,392.

Suitable photopolymerizable compositions are well known to the skilled artisan.

The present invention provides a method for developing such exposed photosensitive elements by contacting them, to remove the non-image areas, using a developer which contains the aforementioned ingredients in an aqueous mixture. The resultant developer has a flash point which is preferably above 200° F. and more preferably at least 220° F.

The potassium toluene sulfonate is preferably present in the aqueous mixture in an amount ranging from about 5% to about 40% by weight of the overall composition. It is more preferably present in an amount of from about 15% to about 35% and most preferably from about 20% to about 30% by weight.

The sodium xylene sulfonate and/or sodium cumene sulfonate component is preferably present in the aqueous mixture in an amount ranging from about 1% to about 20%, more preferably from about 3% to about 15% and most preferably from about 4% to about 10% by weight of the overall composition.

The benzyl alcohol component is preferably present in the aqueous mixture in an amount ranging from about 5% to about 30%, more preferably from about 8% to about 25% and most preferably from about 10% to about 15% by weight of the overall composition.

In a preferred embodiment the composition also contains at least one salt selected from the group consisting of potassium and sodium phosphates, nitrates, chlorides, borates, acetates, sulfates, citrates, sulfites, tartarates, oxalates, formates, propionates, succinates, glutamates and benzoates. The salt component is present in the developer in the amount of from about 0.1% to about 10% by weight of the developer. Preferably it is present in an amount of from about 0.1% to about 3% and more preferably from about 0.1% to about 1%.

In the preferred embodiment, the developer of the present invention preferably contains optional minor amounts of ingredients which aid in processing of the printing plate. Such ingredients include anti-oxidants, a non-ionic or anionic surfactant and other art recognized components such as anti-foam compounds. Anti-oxidants are present to prevent the benzyl alcohol from converting to benzaldehyde.

Useful anti-oxidants non-exclusively include 2,6-ditertiary butyl paracresol, available commercially as Ionol from Shell Chemical Co., Houston, Tex.; tetrakis[methylene(3,5-di-tertiary butyl-4-hydroxy hydrocinnamate)] methane, available as Irganox 1010 from Ciba Geigy; and 3,4,5 trihydroxy benzoic acid propyl ester, available as propyl gallate from Aldrich Chemical Co., Milwaukee, Wis.

The anti-oxidant, when one is employed, is preferably present in an amount ranging from about 0.005 to about 0.2%, more preferably from about 0.01 to about 0.05% by weight of the overall composition.

The composition preferably further contains at least one anionic, or non-ionic surfactant. The surfactant component is present in the developer in an amount of from about 0.1 to about 2% by weight of the developer, preferably from about 0.5% to about 1%. A general formula of useful, preferred surfactants follows:

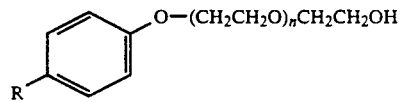

$n = 4-40$
wherein $R = H$
$= OH$
$= C_8H_{17}$
$= C_9H_{19}$
$= C_{10}H_{21}$ and
$= CH_3(CH_2)_m-O-(CH_2CH_2O)_n\cdot CH_2CH_2OH$ wherein
$m = 9-30$
$n = 4-20$ Preferred surfactant species include:
nonylphenoxy polyoxyethylene ethanol polyoxyethylene monosorbitan oleate
tridecylalcohol polyoxyethylene ethanol
isooctyl phenoxy polyoxyethylene ethanol
decyl alcohol polyoxyethylene ethanol
decylphenoxy polyoxyethylene ethanol
isooctyl phenoxy polyoxyethylene ethanol
isooctyl phenoxy ethylene ethanol These surfactants are more fully described in U.S. Pat. No. 4,381,340 which is incorporated herein by reference.

The most preferred surfactants for this invention are octyl phenoxy polyethoxy ethanol, available as Triton TX-100 from Rohm & Haas, Philadelphia, Pa.; and tridecylalcohol polyoxyethylene ethanol, available as Trycol OP407 from Emery Industries, Inc., Cincinnati, Ohio.

Examples of anionic surfactants non-exclusively include ammonium, potassium and sodium lauryl sulfate and sodium tridecyl ether sulfate. The composition then contains sufficient water to formulate an effective developer. The developer is capable of substantially completely removing the non-image areas of a photographic element in about 2 minutes or less while simultaneously removing substantially none of the exposed image areas. Substantially none of the material comprising said removed non-image areas is re-deposited back onto said photographic element.

The following non-limiting examples serve to illustrate the invention.

EXAMPLE 1

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. Such plates are commercially available from American Hoechst Corporation, Somerville, N.J. and use a photosensitive coating comprising a polyvinyl formal resin and a diazonium salt described in U.S. Pat. No. 3,849,392. The thusly exposed plates are processed in a customary developing machine filled with the following developer composition:

|  | Weight % |
|---|---|
| water | 60.50 |
| sodium xylene sulfonate | 29.00 |
| benzyl alcohol | 10.50 |

Although the N-500 plate can be developed satisfactorily, the image on the N-25 plate is totally washed off.

EXAMPLE 2

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. The thusly exposed plates are processed in a customary developing machine filled with the following developer composition:

|  | Weight % |
|---|---|
| water | 60.50 |
| potassium toluene sulfonate | 29.00 |
| benzyl alcohol | 10.50 |

Although the N-25 plate can be developed satisfactorily, the N-500 plate cannot be developed cleanly. Plugging in the screen area is evident.

EXAMPLE 3

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. The thusly exposed plates are processed in a customary developing machine filled with the following developer composition according to the present invention:

|  | Weight % |
|---|---|
| water | 60.50 |
| potassium toluene sulfonate | 23.00 |
| sodium xylene sulfonate | 6.00 |
| benzyl alcohol | 10.50 | both N-25 plate and the N-500 plate are developed cleanly to give printing plates with satisfactory lithographic quality. The coating is developed off as very fine particles.

EXAMPLE 4

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. The thusly exposed plates are processed in a customary developing machine filled with the following developer composition according to the present invention:

|  | Weight % |
|---|---|
| water | 60.50 |
| potassium toluene sulfonate | 23.0 |
| sodium xylene sulfonate | 6.0 |
| benzyl alcohol | 5.5 |

Both the N-25 plate and the N-500 plate are successfully developed although with some difficulty. The coating is developed off in big chunks.

EXAMPLE 5

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. The thusly exposed plates are processed in a customary developing machine filled with the following developer composition according to the present invention:

|  | Weight % |
|---|---|
| water | 45.50 |
| potassium toluene sulfonate | 23.00 |
| sodium xylene sulfonate | 6.00 |
| benzyl alcohol | 25.50 |

Both the N-25 plate and the N-500 plate are developed easily and satisfactorily. However slight developer attack on the image areas is observed.

EXAMPLE 6

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. The thusly exposed plates are processed in a customary developing machine filled with the following developer composition according to the present invention:

|  | Weight % |
| --- | --- |
| water | 49.44 |
| potassium toluene sulfonate | 19.00 |
| sodium xylene sulfonate | 10.00 |
| benzyl alcohol | 10.50 |
| sodium benzoate | 0.20 |
| TX-100 | 0.75 |
| Ionol | 0.01 |

Both the N-25 plate and the N-500 plate are satisfactorily developed but with some difficulty. The coating is developed off as very fine particles.

EXAMPLE 7

An Enco® N-25 printing plate on a mechanically slurry grained aluminum substrate and an Enco® N-500 printing plate on an electrolytically grained aluminum substrate are imagewise exposed to actinic radiation in a manner well known to the skilled artisan. The thusly exposed plates are processed in a customary developing machine filled with the following developer composition according to the present invention:

|  | Weight % |
| --- | --- |
| water | 59.49 |
| potassium toluene sulfonate | 23.00 |
| sodium xylene sulfonate | 6.00 |
| benzyl alcohol | 10.50 |
| sodium benzoate | 0.20 |
| TX-100 | 0.80 |
| Ionol | 0.01 |

Both the N-25 plate and the N-500 plate are developed cleanly to give printing plates with satisfactory lithographic quality. The coating is developed off as very fine particles.

EXAMPLE 8

A coating solution is prepared according to the following composition:

| Phosphoric Acid (85%) | 0.447 g. |
| --- | --- |
| Polyvinyl Acetate (Mowilith 60, Hoechst AG) | 2.790 g. |
| Polystyrene/maleic acid half ester (Scripset 540, Monsanto) | 5.581 g. |
| Para-Phenylazo-diphenylamine | 0.030 g. |
| Acetosol Fire Red 3GLS (Sandoz) | 0.056 g. |
| Diazonium Compound according to the teaching of U.S. Pat. No. 3,849,392 | 5.023 g. |

The above ingredients are added sequentially in 450 g of Methyl Cellosolve (monoethyl ether of ethylene glycol) with vigorous stirring. After all the ingredients are dissolved, the solution is filtered and coated on a slurry grained and hydrophilized aluminum surface. Upon drying, the plate is exposed through a negative film to obtain an acceptable step on a standard Stauffer 21 stepwedge. The exposed plate is developed with an aqueous developer containing the ingredients of Example 7 which satisfactorily removes the unexposed areas, leaving the exposed area as image.

EXAMPLE 9

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

|  | Weight % |
| --- | --- |
| A terpolymer of polyvinyl acetate, polyvinyl alcohol and polyvinyl formal commercially available as Formvar 12/85 | 4.54 |
| Dipentaerythritol monohydroxy pentaacrylate | 2.01 |
| Diacrylated urethane oligomer formed by reacting 1,6-hexane diol with adipic acid in a mole ratio of greater than 1:1 (adipic acid/1,6-hexane diol) to form a polyester and then reacting with dicyclohexyl-methane-4,4'-bis diisocyanate in a 2:1 mole ratio (diisocyanate/polyester). The product is then reacted with 2-hydroxy ethyl acrylate in a 2:1 mole ratio (acrylate/diisocyanate polyester product) | 2.01 |
| Polycondensation product of 3-methoxy-4-diazo-diphenyl amine uslfate and 4,4-bis-methoxy methyl diphenyl ether isolated as the mesitylene sulfonate | 1.22 |
| 2-Stilbenyl-4,6-di(trichloromethyl)triazine | 3.20 |
| Methyl cellosolve | Balance |

The coated and dried plate is exposed to actinic radiation through a negative exposure flat so as to yield a solid seven on a 21 step Stouffer step wedge. The plate is satisfactorily developed using the composition of Example 7.

EXAMPLE 10

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

|  | Weight % |
| --- | --- |
| Binder resin formed by treating 75.0 g of Vinol 523, a polyvinyl alcohol/polyvinyl acetate copolymer which | 4.54 |

| | Weight % |
|---|---|
| has from about 75% to 80% hydroxyl groups by weight and an average molecular weight of about 70,000, and is dissolved in a solution comprising 225.0 g of water and 200.0 g of ethanol for 16 hours at 70° C. after which 10.13 g of hydrochloric acid (37%) is added and the temperature adjusted to 60° C. while mixing vigorously with 37.66 g of propionaldehyde. Using standard analytical techniques this product is found to consist of 13.6% acetate, 9.8% hydroxyl and 76.6% acetal groups. Of the acetal groups, 80% are found to be six-membered cyclic acetal, 4% are five-membered cyclic acetal, and 16% are intermolecular acetals. | |
| Dipentaerythritol monohydroxy pentaacrylate | 2.01 |
| Diacrylated urethane oligomer formed by reacting 1,6-hexane diol with adipic acid in a mole ratio of greater than 1:1 (adipic acid/1,6-hexane diol) to form a polyester and then reacting with dicyclohexyl-methane-4,4'-bis diisocyanate in a 2:1 mole ratio (diisocyanate/polyester). The product is then reacted with 2-hydroxy ethyl acrylate in a 2:1 mole ratio (acrylate/diisocyanate polyester product) | 2.01 |
| Polycondensation product of 3-methoxy-4-diazo-diphenyl amine sulfate and 4,4-bis-methoxy methyl diphenyl ether isolated as the mesitylene sulfonate | 1.22 |
| 2-Stilbenyl-4,6-di(trichloromethyl)triazine | 3.20 |
| Methyl cellosolve | Balance |

The coated and dried plate is exposed to actinic radiation through a negative exposure flat so as to yield a solid seven on a 21 step Stouffer step wedge. The plate is satisfactorily developed using the composition of Example 7.

EXAMPLE 11

A positive working Enco ® P7S positive working printing plate is formed which comprises an aluminic substrate on which is coated a photosensitive composition comprising a novolak resin and a photosensitizer which is an ester of naphthoquinone-(1,2)-diazide-(2)-sulfonic acid-(5) and 1,2,3-trihydroxybenzophenone. It is imagewise exposed through a positive test flat in the customary manner. It is then satisfactorily developed with the composition of Example 7.

EXAMPLE 12

An Enco ® N-25 printing plate on a mechanically slurry grained aluminum substrate and an Enco ® N-500 printing plate on an electrically grained aluminum substrate are imagewise exposed to actinic radiation in a manner well known to the skilled artisan. The thusly exposed plates are processed in a customary developing machine filled with the following developer composition according to the present invention.

| | Weight % |
|---|---|
| water | 59.88 |
| sodium cumene sulfonate | 6.00 |
| benzyl alcohol | 10.32 |
| potassium toluene sulfonate | 23.00 |
| sodium benzoate | 0.20 |
| TX-100 | 0.60 |

Both plates are satisfactorily developed.

What is claimed is:

1. A method for preparing a photographic element which comprises imagewise exposing a photographic element, and removing the non-image areas thereof by contacting said element with a composition consisting essentially of in admixture:
   a) from at least about 5% to about 30% by weight of the developer of benzyl alcohol; and
   b) from about 1% to about 20% by weight of the developer of one or more compounds selected from the group consisting of sodium xylene sulfonate and sodium cumene sulfonate; and
   c) from about 5% to about 40% by weight of the developer of potassium toluene sulfonate; and
   d) water in sufficient amount to formulate an effective developer for imagewise exposed photographic elements.

2. The method of claim 1 wherein said composition further contains one or more surfactants having the formula

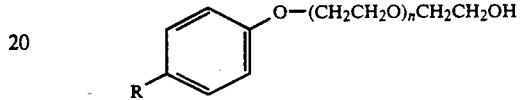

wherein n=4-40
wherein

R = H
= OH
= $C_8H_{17}$
= $C_9H_{19}$
= $C_{10}H_{21}$ or
= $CH_3(CH_2)_m$—O—$(CH_2CH_2O)_{n'}$·$CH_2CH_2OH$ wherein
m=9-30
n'=4-20.

3. The method of claim 1 wherein the composition further comprises one or more compounds selected from the group consisting of antioxidants, salts anionic surfactants, non-ionic surfactants and antifoam agents.

4. The method of claim 1 wherein the composition further contains one or more salts selected from the group consisting of potassium and sodium phosphates, nitrates, chlorides, borates, acetates, sulfates, citrates, sulfites, tartarates, oxalates, formates, propionates, succinates, glutamates and benzoates.

5. The method of claim 4 wherein said salt is present in an amount of from about 0.1% to about 3% by weight of the developer.

6. The method of claim 1 further wherein the composition further contains one or more antioxidants selected from the group consisting of 2,6 di tertiary butyl para-cresol; tetrakis [methylene(3,5-ditertiary butyl-4-hydroxy hydrocinnamate)] methane; and 3,4,5-trihydroxy benzoic acid propyl ester.

7. The method of claim 6 wherein said antioxidant is present in an amount of from about 0.005% to about 0.2% by weight of the developer.—

8. The method of claim 2 wherein said surfactant is present in an amount ranging from about 0.1% to about 2% by weight of the developer.

9. The method of claim 1 wherein the composition further contains one or more surfactants selected from the group consisting of octyl phenoxy polyethoxy ethanol, and tridecylalcohol polyoxyethylene ethanol.

10. The method of claim 9 wherein said surfactant is present in an amount ranging from about 0.1% to about 2% by weight of the developer.

11. The method of claim 1 wherein the composition further contains from about 0.1% to about 2% by weight o the developer of an anionic surfactant.

12. The method of claim 11 wherein said anionic surfactant is selected from the group consisting of ammonium, potassium and sodium lauryl sulfate and sodium tridecyl ether sulfate.

13. The method of claim 1 wherein the composition further contains from about 0.1% to about 3% by weight of the developer of one or more salts selected from the group consisting of potassium and sodium phosphates, nitrates, chlorides, borates, acetates, sulfates, citrates, sulfites, tartarates, oxalates, formates, propionates, succinates, glutamates and benzoates; and from about 0.005% to about 0.2% by weight of the developer of one or more antioxidants selected from the group consisting of 2,6-di-tertiary butyl paracresol; tetra-kis[methylene(3,5-di-tertiary butyl-4-hydroxy hydrocinnamate)] methane; and 3,4,5-trihydroxy benzoic acid propyl ester; and from about 0.1% to about 2% by weight of the developer of one or more surfactants having the formula

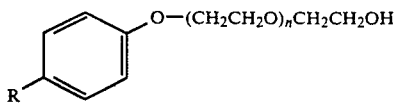

wherein
$R = H$, $OH$, $C_8H_{17}$, $C_9H_{19}$, $C_{10}H_{21}$, or $CH_3(CH_2)_m$—$O$—$(CH_2CH_2O)_{n'}CH_2CH_2OH$
$m = 9-30$
$n = 4-40$
$n' = 4-20$ 14. The method of claim 13 wherein said composition comprises either or both of octyl phenoxy polyethoxy ethanol and tridecylalcohol polyoxyethylene ethanol.

* * * * *